US007930070B2

(12) United States Patent
Imes

(10) Patent No.: US 7,930,070 B2
(45) Date of Patent: Apr. 19, 2011

(54) SYSTEM, METHOD, AND MODULE CAPABLE OF CURTAILING ENERGY PRODUCTION WITHIN CONGESTIVE GRID OPERATING ENVIRONMENTS

(75) Inventor: Kevin R. Imes, Austin, TX (US)

(73) Assignee: Kingston Consulting, Inc., Austin, TX (US)

( * ) Notice: Subject to any disclaimer, the term of this patent is extended or adjusted under 35 U.S.C. 154(b) by 0 days.

(21) Appl. No.: 12/567,394

(22) Filed: Sep. 25, 2009

(65) Prior Publication Data

US 2010/0076613 A1 Mar. 25, 2010

Related U.S. Application Data

(60) Provisional application No. 61/099,995, filed on Sep. 25, 2008, provisional application No. 61/227,860, filed on Jul. 23, 2009, provisional application No. 61/226,899, filed on Jul. 20, 2009.

(51) Int. Cl.
*G01R 21/133* (2006.01)
*G06F 17/00* (2006.01)

(52) U.S. Cl. ........................................ 700/291; 700/297

(58) Field of Classification Search .................. 700/291, 700/297, 298; 705/412
See application file for complete search history.

(56) References Cited

U.S. PATENT DOCUMENTS

| | | | | |
|---|---|---|---|---|
| 5,974,403 | A | 10/1999 | Takriti et al. | |
| 7,233,843 | B2 | 6/2007 | Budhraja et al. | |
| 7,392,114 | B2 | 6/2008 | Wobben | |
| 2007/0124025 | A1 | 5/2007 | Schram et al. | |
| 2009/0326724 | A1 * | 12/2009 | Lasseter et al. | 700/287 |

FOREIGN PATENT DOCUMENTS

WO 2009063220 A2 5/2009

OTHER PUBLICATIONS

Morey, M., Kirsch, L., Wagner, B., and Hansen D. "Forecasting Transmission Loading Relief Calls with Publicly Available Information". Electric Power Research Institute Report No. 1013775 (2007): abstract.*

Yang, H., Zhou, R. "Monte Carlo Simulation Based Price Zone Partitioning Considering Market Uncertainty". 9th International Conference on Probabilistic Methods Applied to Power Systems (Jun. 2006): 1-5.*

Waniek, D., Hager, U., Rehtanz C., Handschin, E. "Influences of Wind Energy on the Operation of Transmission Systems". Power and Energy Society General Meeting, 2008 IEEE (Jul. 2008): 1-8.*

Morey, M., Kirsch, L., Wagner, B., and Armstrong D. "Managing Transmission Curtailment Risk Through Forecasts of Transmission Loading Relief Calls". Electric Power Research Institute Report No. 1015871 (2008).*

Morey M., Kirsch, L. "Managing Transmission Curtailment Risk in Wholesale Power Markets". The Electricity Journal (2009): 26-37.*

* cited by examiner

*Primary Examiner* — Ryan A Jarrett
(74) *Attorney, Agent, or Firm* — Dickinson Wright PLLC

(57) ABSTRACT

A system, method, and module capable of curtailing energy production within congestive grid operating environments, according to are an aspect, including a method of managing power generation of a power generation site operable to be coupled to a transmission line is disclosed. The method can also include detecting a transmission line operating characteristic, and detecting a curtailment action data of the transmission line operating characteristic. Additionally, the method can include determining a forecasted curtailment probability level as a function of the transmission line operating characteristic and the curtailment action data.

18 Claims, 8 Drawing Sheets

SYSTEM, METHOD, AND MODULE CAPABLE OF CURTAILING ENERGY PRODUCTION WITHIN CONGESTIVE GRID OPERATING ENVIRONMENTS

CROSS REFERENCE TO RELATED APPLICATION

The present application claims benefit of U.S. Provisional Patent Application Ser. No. 61/099,995, entitled "System, Method, And Monitor To Predict Energy Outputs of Alternative Energy", filed on Sep. 25, 2008, U.S. Provisional Patent Application Ser. No. 61/227,860, entitled "Congestion Detection, Curtailment, Storage, and Dispatch Module", filed on Jul. 23, 2009, and U.S. Provisional Patent Application Ser. No. 61/226,899, entitled "Congestion Detection, Curtailment, Storage, And Dispatch Module", filed on Jul. 20, 2009.

TECHNICAL BACKGROUND

The present disclosure relates generally to energy management systems. More specifically, the present disclosure relates to a system, method, and module capable of curtailing energy production within congestive grid operating environments.

BACKGROUND INFORMATION

Increasing pressure on utility companies to output clean energy is quickly becoming an issue for energy companies. Traditional energy generation from coal results in green house gas (GHG) emissions that are rapidly being mandated for reduction. Emerging alternative energy technologies such as wind and solar provide viable options for energy companies to add to their portfolio. However, wind and solar are dependent on environmental conditions which can lead to inconsistent energy production. For example, if a wind farm experiences high wind velocities, energy capacity increases. However, the additional capacity may not map to available demand, and grid congestion can result. Other times, when wind levels are low, little or no energy is produced, causing a deficiency or lack of available energy. Additional drivers are also affecting the energy industry. For example, states are placing demands on power companies to predict the output of alternative energy sources when they are plugged into the grid. However, the variable output from alternative energy sources used by small and large energy companies make it difficult to align future supply with future demand.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

Figure 1:
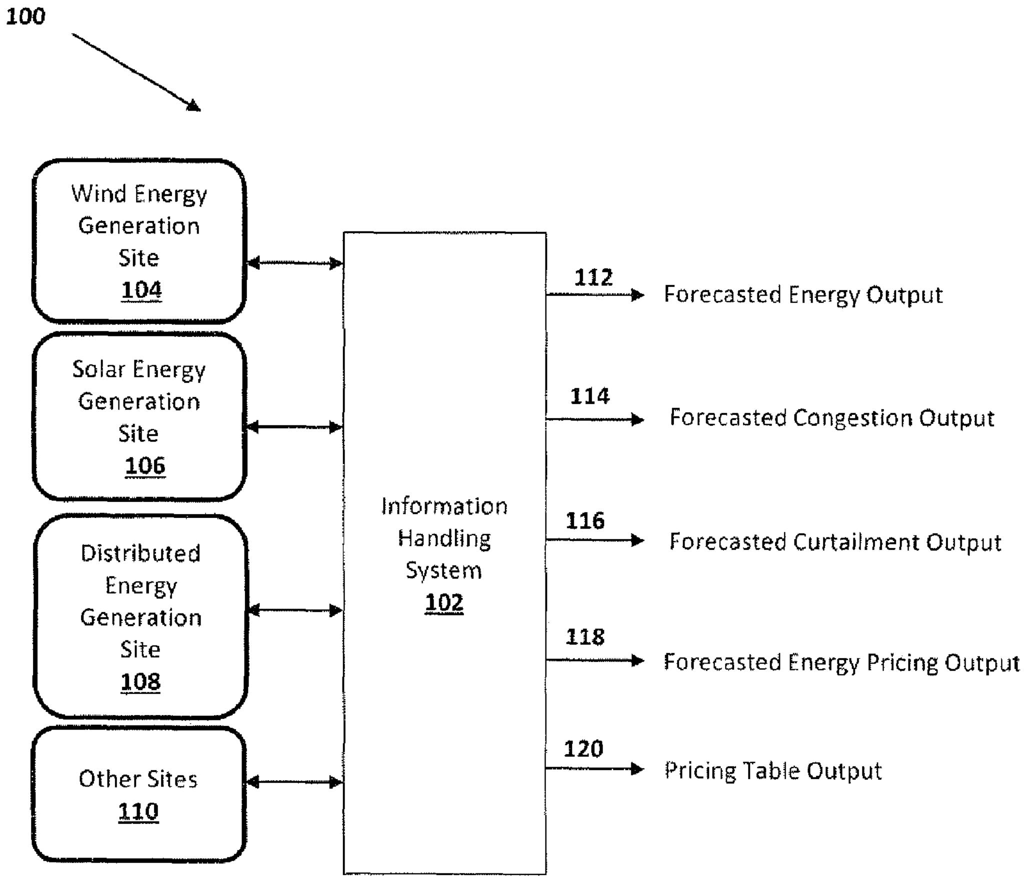
FIG. 1 illustrates a block diagram of an energy management system configured to manage one or more energy generators according to an aspect of the disclosure.

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application. The teachings can also be utilized in other applications and with several different types of architectures such as distributed computing architectures, client/server architectures, or middleware server architectures and associated components.

Devices or programs that are in communication with one another need not be in continuous communication with each other unless expressly specified otherwise. In addition, devices or programs that are in communication with one another may communicate directly or indirectly through one or more intermediaries.

Embodiments discussed below describe, in part, distributed computing solutions that manage all or part of a communicative interaction between network elements. In this context, a communicative interaction may be intending to send information, sending information, requesting information, receiving information, receiving a request for information, or any combination thereof. As such, a communicative interaction could be unidirectional, bidirectional, multi-directional, or any combination thereof. In some circumstances, a communicative interaction could be relatively complex and involve two or more network elements. For example, a communicative interaction may be "a conversation" or series of related communications between a client and a server—each network element sending and receiving information to and from the other. The communicative interaction between the network elements is not necessarily limited to only one specific form. A network element may be a node, a piece of hardware, software, firmware, middleware, another component of a computing system, or any combination thereof.

For purposes of this disclosure, an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a PDA, a consumer electronic device, a smart phone, a network server or storage device, a switch router, wireless router, or other network communication device, or any other suitable device and can vary in size, shape, performance, functionality, and price. The information handling system can include memory, one or more processing resources such as a central processing unit (CPU) or hardware or software control logic. Additional components of the information handling system can include one or more storage devices, one or more communications ports for communicating with external devices as well as various input and output (I/O) devices, such as a keyboard, a mouse, and a video display. The information handling system can also include one or more buses operable to transmit communications between the various hardware components.

In the description below, a flow charted technique or algorithm may be described in a series of sequential actions. Unless expressly stated to the contrary, the sequence of the actions and the party performing the actions may be freely changed without departing from the scope of the teachings. Actions may be added, deleted, or altered in several ways. Similarly, the actions may be re-ordered or looped. Further, although processes, methods, algorithms or the like may be described in a sequential order, such processes, methods, algorithms, or any combination thereof may be operable to be performed in alternative orders. Further, some actions within a process, method, or algorithm may be performed simultaneously during at least a point in time (e.g., actions performed in parallel), can also be performed in whole, in part, or any combination thereof.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single device is described herein, more than one device may be used in place of a single device. Similarly, where more than one device is described herein, a single device may be substituted for that one device.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the computing, electronics, and software arts.

According to an aspect of the disclosure, a method of managing power generation of a power generation site operable to be coupled to a transmission line is disclosed. The method can include detecting a transmission line operating characteristic, and detecting a curtailment action data of the transmission line operating characteristic. The method can also include determining a forecasted curtailment probability level as a function of the transmission line operating characteristic and the curtailment action data.

According to a further aspect of the disclosure, an energy management system configured to manage power generation of a power generation site operable to be coupled to a transmission line is disclosed. The energy management system can include an information handling system operable to detect a transmission line operating characteristic, detect a curtailment action data of the transmission line operating characteristic, and determine a forecasted curtailment probability level as a function of the transmission line operating characteristic and the curtailment action data. The information handling system can further detect the forecasted curtailment probability level being above the predetermined curtailment probability level. The energy management system can also include a remote module communicatively coupled to the information handling system and operable to initiate a reduction of the electricity being transmitted to the transmission line in response to the forecasted curtailment probability level being above the predetermined curtailment probability level.

The present disclosure also discloses a solution that addresses a current and developing need for proactive management of alternative energy assets including wind and solar assets. The ability to curtail and store energy is important for the future reliance and acceptance of alternative energy assets and will lead to increased grid stability. The present disclosure provides a framework that will allow for proactive management of alternative energy production through asset monitoring and characterization relative to real-time and anticipated grid conditions. The present disclosure employs a curtailment and storage module that includes localized logic that can automatically curtail assets as needed, while allowing energy storage during peak congestion periods. Further, the local logic can also automatically dispatch stored energy during forecasted or detected peak demand periods. The curtailment and storage module can be used to aid in reducing congestion in individual markets, such as the Electric Reliability Council of Texas (ERCOT) market, through proactive curtailment of energy solutions. However, it could be employed in a variety of different markets, and in some instances can allow energy producing assets to be deployed based on current grid operating conditions for specific markets such as ERCOT, Southwest Power Pool (SPP), California Independent System Operator (CAISO), Western Electric Coordinating Council (WECC), future national or regional grids, operators, councils, or any combination thereof.

The solution further includes a congestion detection and proactive energy curtailment module. The present disclosure focuses on reducing congestion through proactive curtailment of energy output levels for asset owners. The module can also include a secure, intelligent data framework allowing for real-time data feeds, application links, and enterprise reporting of critical operating conditions. Deployment of the module and an energy management system can lead to increased grid stability and reduce adverse operating conditions (e.g. congestion, undersupply) in zonal and nodal grid markets or topologies.

An objective of the present disclosure includes reducing congestion in certain zones of the ERCOT market through proactive curtailment of energy output levels at wind generation sites. However, the present disclosure can be utilized in a variety of different markets or combinations of markets. The present disclosure provides an architecture that can forecast congestion in nodal and zonal markets, and issue preemptive curtailments to reduce energy output levels and congestion. The present disclosure allows wind and solar asset owners and operators to realize economic gain through reduced wear and tear on wind and solar energy assets, while ensuring energy can be output during appropriate demand periods thereby relieving any burden that may be placed on the grid. The present disclosure further can include a module that can interface with phasor measurement units (PMU) devices, PMU data concentrators, PMU data or information streams, or any combination thereof.

FIG. 1 illustrates a block diagram of an energy management system, illustrated generally at 100, configured to manage one or more energy generators according to an aspect of the disclosure. Energy management system 100 includes an information handling system 102 that can be coupled to one or more energy generation sites. For example, information handling system 102 can be coupled to a wind energy generation site 104, a solar energy generation site 106, a distributed energy generation site 108, other generation sites 110 that can include various other alternative energy generation resources, traditional energy generation sources (e.g. coal, natural gas, etc.) or any combination thereof. Information handling system 102 can be used to generate one or more outputs including a forecasted energy output 112 that can be used to forecast energy output levels of a single generator, multiple generators, a single site, multiple sites, or any combination of thereof. Information handling system 102 can also output a forecasted congestion output 114 of a portion or portions of a grid, a forecasted curtailment output 116 which can include a proactive curtailment output, a forced curtailment output, or any combination thereof, a forecasted energy pricing output 118 of a single generator, multiple generators, or any combination thereof, and a pricing table output 120 which can include multiple pricing levels or pricing curves of a single generator, multiple generators, or any combination thereof. Information handling system 102 can be used to generate any combination of outputs, and can further be used to configure the outputs in a format that can be used by a system, module, server, or various other type of information handling systems, networks, network devices, or combinations thereof capable of using outputs from information handling system 102.

According to an aspect, wind farm generation site 104 can include a single wind energy generating asset, or can include multiple wind energy generating assets. Similarly, solar energy generation site 106 can include multiple solar arrays, solar concentrators, etc. or a single solar energy generating asset. According to a further aspect, each site can include more than one type of energy producing asset. For example, a wind energy generating asset can be collocated with a solar generating asset, natural gas power generator, biomass power generator, geothermal power generator, or any combination thereof. As such, wind energy generation site 104 need not be limited to producing power only from wind power generators. Further, such combinations are not limited to wind energy generation site 104, and can be used at any of the sites within energy management system 100.

According to a further aspect, although illustrated as single generation sites, each site can include multiple generation sites and need not be limited to a single site or type of site. Additionally, each site can be regionally located, geographically dispersed, or any combination thereof. According to another aspect, each site can be located in a single energy market such as ERCOT, SPP, CAISO, WECC, a national energy grid, or others. However, in other embodiments, each site, or combination of sites, can be located be located in a specific market and participate in another market. For example, a wind energy generation site can be located in SPP and participate in ERCOT, WECC, a national energy grid, or any combination of grids. As such, energy management system 100 can be used to initiate outputting energy to multiple grids.

During operation, energy management system 100 can be used to manage one or more generation sites. According to an aspect, energy management system 100 can be used to manage sites that are owned by the same owner or operator. However, in other forms, energy management system 100 can be used to manage sites that may not be owned by the same owner or operator. Energy management system 102 can be used to manage operations and pricing energy of one or more sites. Information handling system 102 can communicate with each site and can further model and simulate grid conditions. In a particular form, information handling system 102 can receive inputs from multiple sources, and can be used to detect when congestion is going to occur within a portion of an energy transmission grid.

According to an aspect, information handling system 100 can model grid conditions and forecast when congestion may occur under a variety of conditions. For example, changes in load centers can cause changes in congestion within an energy transmission grid. Other variables such as changes in wind speeds, irradiance levels, or other environmental conditions can alter energy production of alternative energy producing assets. As such, changes in environmental conditions can increase or decrease congestion along portions of an energy transmission grid. Information handling system 102 can be used to model future outputs of multiple alternative energy producing sites. For example, in addition to modeling future outputs of a site that may be under management by energy management system 100, information handling system 102 also forecasts energy output of sites that may impact the level of energy coupled to a portion of the transmission grid. In this manner, energy management system 100 can forecast energy levels of each site connected to a portion of the grid, and based on environmental conditions alter energy pricing, output levels, pricing tables, curtailment levels, energy storage levels, or various other outputs that can be altered by an energy management system 100.

Figure 2:
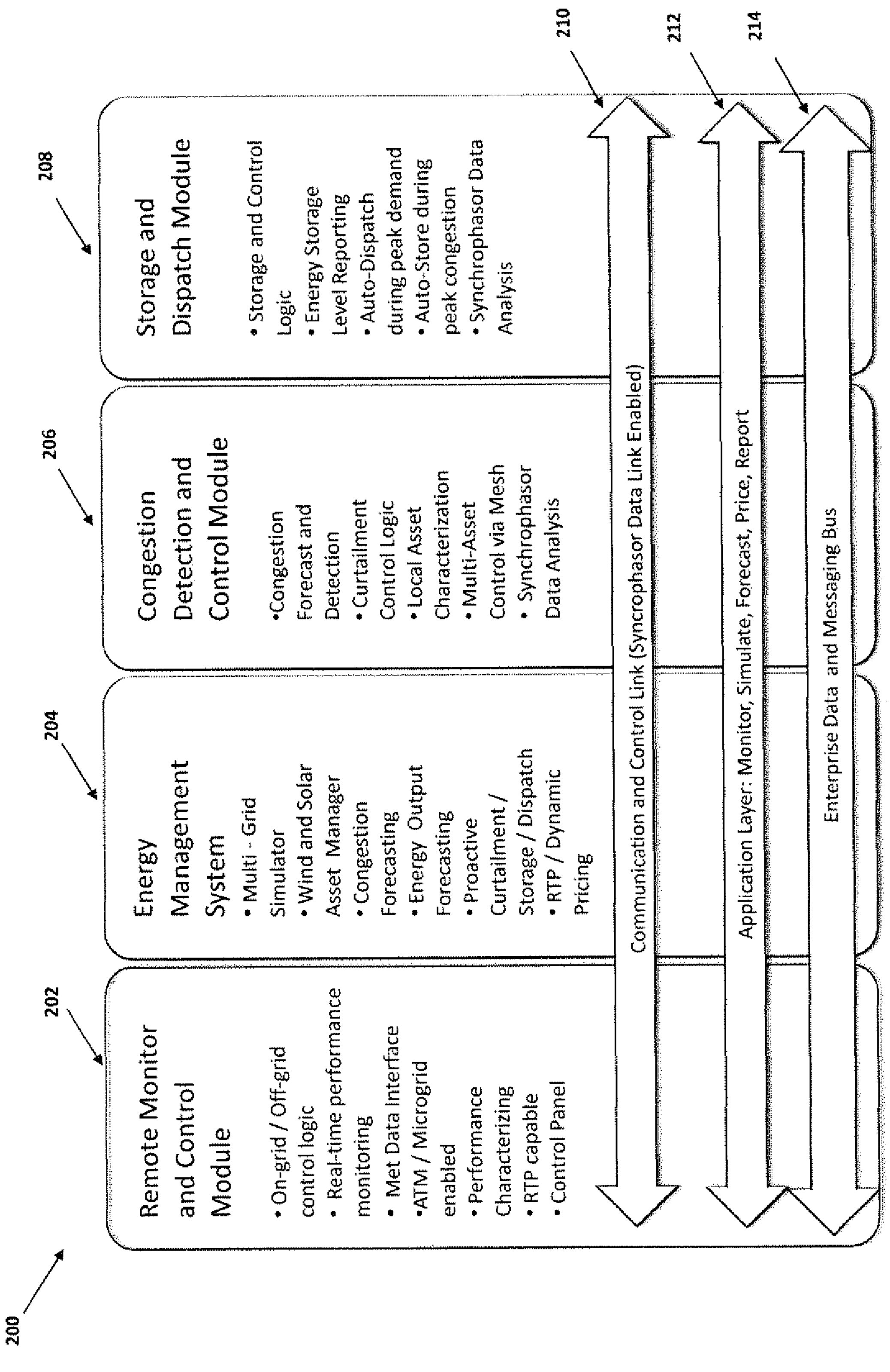
FIG. 2 illustrates an information framework to communicate energy information across a network according to an aspect of the disclosure.

FIG. 2 illustrates an information framework, illustrated generally at 200, to communicate energy information across a network according to an aspect of the disclosure. Information framework 200 can be used to connect multiple devices, modules, and systems. For example, information framework 200 can connect a remote monitor and control module 202, an energy management system 204, a congestion detection and control module 206, and a storage and dispatch module 208. Information framework 200 can include multiple layers that can include specific features or functions. For example, information framework 200 can include a communication and control link 210, an application layer 212, and an enterprise data and messaging bus layer 214. Each of the modules or systems can be configured to gain access to each of the layers as needed or desired.

According to a further aspect, communication and control link layer 210 can be a syncrophasor data link enabled layer that can allow access to a phasor measure units or data concentrators having syncrophasor data. In other forms, application layer 212 can be used to monitor, simulate, forecast, price, and generate reports in association with managing an energy production site or multiple energy production sites.

According to a further aspect, remote monitor and control module 202 can be used at a single site having a single asset, or can be deployed in a multiple asset configuration, with a remote monitor and control module 202 being collocated with an asset. Remote monitor and control module 202 can access information framework 200, and can include on-grid and off-grid control logic, real-time performance monitoring, meteorological data interface, microgrid or asynchronous transmission capabilities, local performance characterization logic, a control panel, or various combinations of features.

According to a further aspect, energy management system 204 can be used with information framework 200. Energy management system 204 can be used to manage a single site having a single asset, or can be deployed in a multiple asset configuration. Energy management system 204 can include a multi-grid simulator, a wind and solar asset manager, can perform congestion forecasting, energy output forecasting, proactive curtailments, storage control, dispatch control, real-time pricing, dynamic pricing, or various combinations of features.

According to a further aspect, congestion detection and control module 206 can be used with information framework 200. Congestion detection and control module 206 can be used to manage a single site having a single asset, or can be deployed in a multiple asset configuration. Congestion detection and control module 206 can include congestion forecast and detection logic, curtailment logic, local asset characterization capabilities, multi-asset control using a meshed or other communication network, syncrophasor data analysis capabilities, or various combinations of features.

According to a further aspect, storage and dispatch module 208 can be used with information framework 200. Storage and dispatch module 208 can be used to manage a single site having a single asset, or can be deployed in a multiple asset configuration. Storage and dispatch module 208 can include storage and control logic, energy storage level reporting, auto-dispatch during peak demand capabilities, auto-store during peak congestion capabilities, syncrophasor data analysis capabilities, or various combinations of features.

Any combination of features at each of the modules or systems illustrated in FIG. 2 can be combined as desired.

Figure 3:
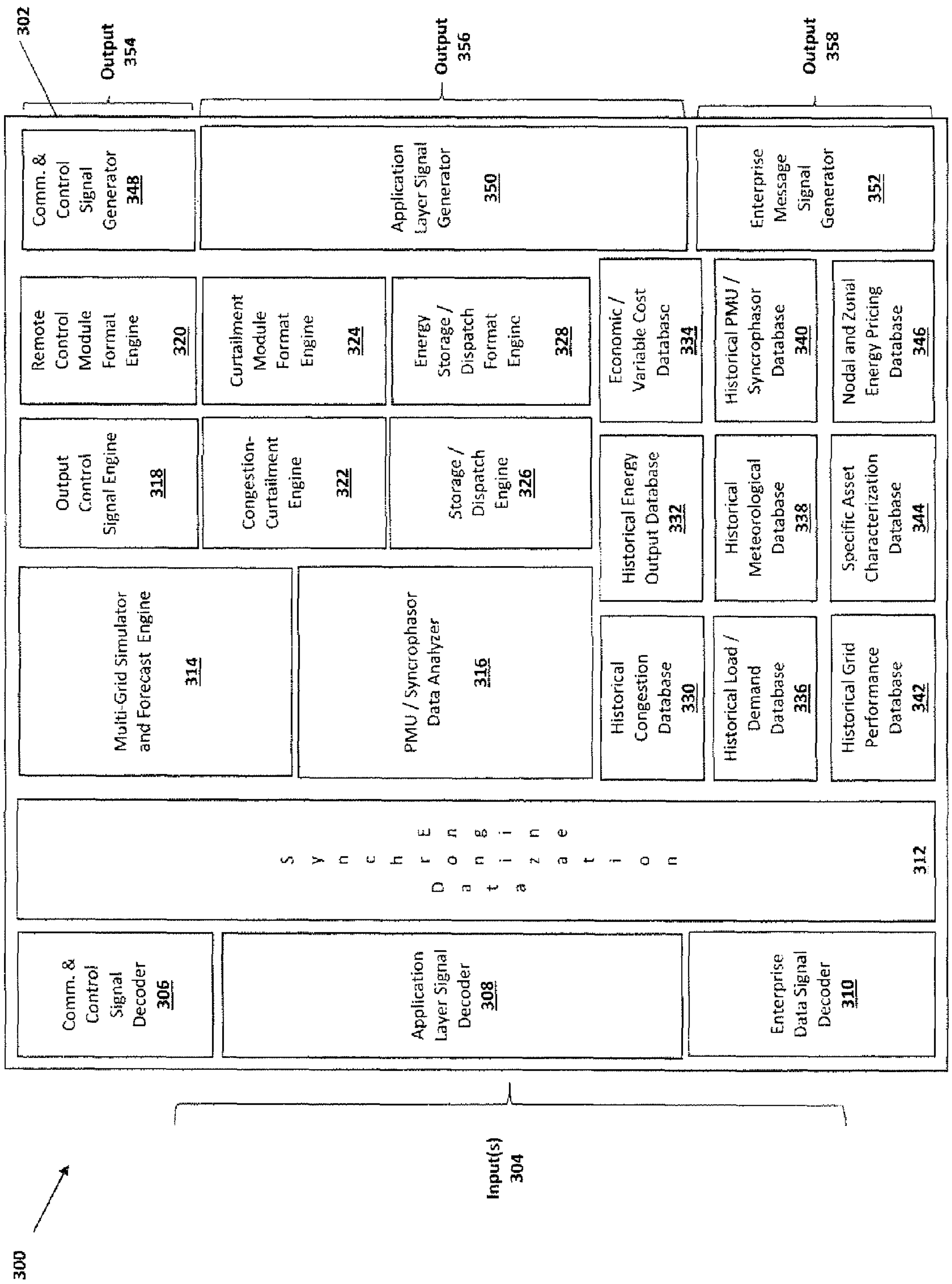
FIG. 3 illustrates a block diagram of an energy management system according to an aspect of the disclosure.

FIG. 3 illustrates a block diagram of an energy management system, illustrated generally at 300, according to another aspect of the disclosure. Energy management system 300 can include an information handling system 302 that can include one or more inputs 304 which can include any combination of real-time congestion data, energy transmission line operating conditions, syncrophasor data, firm owned alternative energy generator operating status, non-firm owned alternative energy generator operating status, locational marginal pricing data, congestion revenue rights data, energy storage capacity, stored energy output capacity, real time energy pricing data, historical energy pricing data, real time nodal demand data, historical nodal demand data, real time zonal demand data, historical zonal demand data, external market demand data, historical external market demand data, nodal price data, real time energy price data, real time energy demand data, historical energy demand data, historical energy price data, firm owned alternative energy generator data, non-firm owned alternative energy generator data, est. firm owned alternative energy generator output schedule, estimated non-firm owned alternative energy generator output schedule, macro environmental data, micro environmental data, real-time grid congestion data, historical grid congestion data, renewable energy credit information, carbon credit cap and trade pricing information, fixed and variable costs for operating alternative energy generators, production tax credit (PTC) pricing information, investment tax credit (ITC) information, federal grant information, credit-to-grant comparison analysis data, PTC to ITC analysis data, interest/finance data for alternative energy generators, current depreciation data for assets, available solar and wind output capacity, distributed energy data, feed-in tariff data, baseline energy generator data, load utilization data, transmission efficiency data, congestion right revenue data, priority dispatch data, federal renewable portfolio standard (RPS) data, state renewable portfolio standard (RPS) data, state net-metering data, current state % coal production data, current state % natural gas production data, current state % green house gas production data, coal pricing data, natural gas pricing data, oil pricing data, transmission pricing data, or any combination thereof. Other types of data that can be used by information handling system 302 to manage energy production sites, energy production assets, or various combinations thereof, can also be assessed and used.

According to an aspect, information handling system 302 can include a communication and control signal decoder 306, an application layer signal decoder 308, and an enterprise data signal decoder 310. Each decoder 306, 308, 310, can be used to process various inputs 304 that can be used by the information handling system 302. For example, one or more of the inputs 304 can be received from separate data sources using various formats. As such, decoders 306, 308, 310 can be used to detect the various inputs, and decode inputs into a format that can be used by information handling system 302. In a particular form, the inputs can be provided using a smart-grid data framework as described in FIG. 2 above. Other formats can also be used to receive and use the inputs 304 as desired. According to a further aspect, formats for each data type can be stored within a memory accessible to information handling system 302, and can be accessed and to translate or decode inputs.

Information handling system 302 can also include a data synchronization engine 312 configured to synchronize inputs 304. For example, one or any combination of inputs 304 can include date information, time information, location information, unique identifying information, or any combination thereof. Data synchronization engine 312 can be used to synchronize various combinations of information or data using one or more variables. For example, information handling system 302 can receive inputs from multiple different sites. As such, data synchronization engine 312 can use a site identification reference to extract data from a communication or data stream input to information handling system 302. Data synchronization engine 312 can further synchronize wind level data and energy output data on a site-by-site basis, an asset-by-asset basis, a region-by-region basis, a node-by-node basis, a zone-by-zone basis, or various other criteria, or any combination thereof. Information handling system 302 can then process multiple data stream inputs from multiple sources, and synchronize inputs as desired. In this manner, wind energy output levels can be auto-correlated to wind speed levels, and forecasted energy output levels can be generated.

According to another aspect, data synchronization engine 312 can access an updateable listing or table of input references, and can further include groupings of data that can be synchronized and used by information handling system 302. In this manner, information handling system 302 can efficiently manage data that can be used to manage energy producing sites.

Information handling system 302 can further include a multi-grid simulator and forecast engine 314 operable to simulate grid conditions of one or more grid or grid locations.

For example, the multi-grid simulator can be used to model a single grid or market, such as ERCOT, SPP, CAISO, etc., or in other forms can be used to simulate portions of each grid or market. According to a further aspect, the multi-grid simulator and forecast engine 314 can be used to simulate multiple grids or markets in parallel. For example, ERCOT and SPP can both be simulated and several outputs can be modeled and forecasted. According to an aspect, one or more generators, may be geographically located in a different market. For example, a first wind farm may be located within the SPP market and can be used to supply energy to the ERCOT market, the SPP market, or any combination thereof. Multi-grid simulator and forecast engine 314 can then be used to model each grid and initiate outputting energy based on forecasted grid and market conditions. In another form, multi-grid simulator and forecast engine 314 can be used to forecast congestion in a first market, such as ERCOT, and initiate outputting energy to a non-congested market or grid, such as SPP, CAISO, a national renewable energy grid, or any combination thereof. According to a further aspect, energy management system 300 can be configured to be used with smart grid protocols, and can further use regional meteorological forecast data such as data provided by AWS, 3Tier, and the like.

Information handling system 302 can further include a phasor measurement unit (PMU) and syncrophasor data analyzer 316 configurable to analyze PMU data received from one or more PMU sources, PMU data concentrator units, or other PMU data sources. For example, a PMU can measure electrical waves on an electricity grid to determine operating characteristics of an electricity grid. According to an aspect, a PMU can be a dedicated device, or a PMU function can be incorporated into a protective relay, remote device, monitoring device, site controller, or other devices.

Information handling system 302 further includes an output control signal engine 318, a remote control module format engine 320, a congestion and curtailment engine 322, and a curtailment module format engine 324. Information handling system 302 can also include an energy storage and dispatch engine 326, and an energy storage and dispatch format engine 328.

Information handling system 302 can further include one or more databases, which can be stored as separate databases, combined within a single database, or any combination thereof. Additionally, several different types of database storage systems and software can be used to store data, and in some forms, data can be stored within local memory as a database. For example, information handling system 302 can include a random access memory having a range of memory locations to store information. In other forms, data can be stored within a remote storage device located at a data center, at a generation site, at a customers data storage site, or any combination thereof. Databases can include a historical congestion database 330, a historical energy output database 332, an economic and variable cost database 334, a historical load and demand response database 336, a historical meteorological database 338, a historical PMU and syncrophasor database 340, a historical grid performance database 342, an asset characterization database 344, a nodal and zonal energy pricing database 346, various other types of databases related to energy management, or any combination thereof.

Information handling system 302 can further include any combination of a communication and control signal generator 348, an application layer signal generator 350, and an enterprise message signal generator 352. According to an aspect, a control signal generator 348 can be used to generate an output 354 that can include one or more outputs communicated to one or more locations. For example, output 354 can include one or any combination of a syncrophasor data link output, generator control output, dispatch control output, proactive curtailment control output, storage control output, battery storage control output, battery dispatch control output, auxiliary power dispatch control output, or various other types of signals that can be communicated as output 354.

According to an aspect, application layer signal generator 350 can be used to generate an output 356 that can include one or more outputs communicated to one or more locations. For example, output 356 can include one or any combination of a grid monitor output, power output forecast output, congestion forecast output, grid simulation output, energy pricing generator output, report generator output, control panel output, or various other types of signals that can be communicated as output 356.

According to an aspect, enterprise message signal generator 352 can be used to generate an output 358 that can include one or more outputs communicated to one or more locations. For example, output 358 can include one or any combination of a administrator messaging output, data publishing output, SCED messaging output, QSE messaging output, grid messaging output, performance messaging output, status messaging output, eminent domain messaging output, emergency condition messaging output, operations messaging output, text or paging system messaging output, or various other types of signals that can be communicated as output 358.

According to an aspect, information handling system 302 can include a CPLEX modeling system that can be used to simulate and model grid activities. Additionally, information handling system can deploy a third party software application, such as GE MAPS, PLEXOS, UPLAN, or various other grid simulation and modeling tools. Operating characteristics of each tool, and a specific market, can also be considered. For example, characteristics or tools such as transmission network type such as DC power flow, AC power flow, or combined availability, unit commitment, lagrangian relaxation, missed integer programming, energy and ancillary services interaction such as none, separate clearing, sequential clearing, or co-optimization. Other characteristics or tools can also include congestion revenue rights auction calculations and bidding, generation expansion including exogenous, endogenous, merchant plant modeling, load modeling on an periodic basis such as hourly, zone levels, distribution factor, specific market modeled, stochastic modeling, Monte Carlo simulation, deterministic modeling, stochastic variables, nodal capabilities, optimal power flow modeling, congestion detection or any combination thereof.

Figure 4:
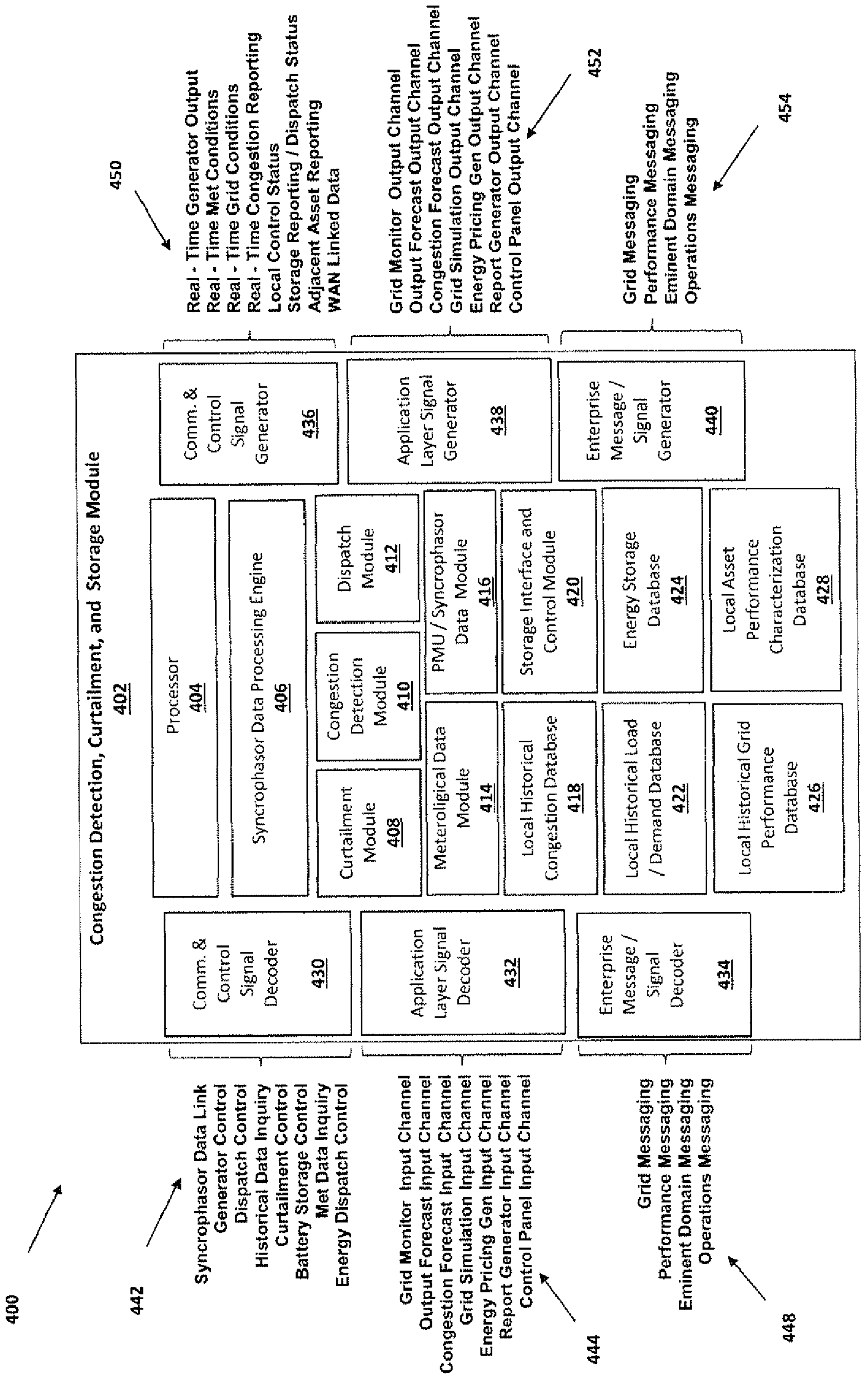
FIG. 4 illustrates a block diagram of remote module according to an aspect of the disclosure.

FIG. 4 illustrates a block diagram of remote module, illustrated generally at 400, according to an aspect of the disclosure. Remote module 400 can be configurable to curtail energy outputs of energy producing assets prior to and during periods of congestion. Remote module 400 can include a congestion detection, curtailment and storage module (CDCSM) 402 that can be used to detect congestion and curtail energy outputs when congestion may be detected or forecasted. CDCSM 402 can include a processor 404, a synchrophasor data processing engine 406, a curtailment module 408, a congestion detection module 410, and a dispatch module 412. CDCSM 402 can also include meteorological data module 414, and a PMU/syncrophasor data module 416. CDCSM 402 can further include one or more databases such as a local historical congestion database 418, a local historical load and demand response database 422, an energy storage database 424, a local historical grid performance database 426, and a local asset characterization and performance database 428. Other databases can also be provided including a PMU/syncrophasor database configured to store PMU/syncrophasor data, or other databases that can store information received or generated by remote module 400.

Remote module 400 can also receive inputs using one or more decoders. For example, remote module 400 can include a communication and control signal decoder 430, an application layer signal decoder 432, and an enterprise message and signal decoder 434, or any combination thereof. Various communication mediums and protocols can be used by remote module 400. Remote module 400 can also output signals using a communication and control signal generator 436, an application layer signal generator 438, and an enterprise message and signal generator 440.

According to an aspect, communication and control signal decoder 430 can be coupled to one or more inputs 442, such as a syncrophasor data link, a generator control signal, a dispatch control signal, a historical data inquiry signal, a curtailment control signal, a battery storage control signal, a met data inquiry signal, an energy dispatch control signal, or any combination thereof.

According to another aspect, application layer signal decoder 432 can be coupled to one or more inputs 444, such as a grid monitor input channel, output forecast input channel, congestion forecast input channel, grid simulation input channel, energy pricing gen input channel, report generator input channel, control panel input channel, or any combination thereof.

According to a further aspect, enterprise message and signal decoder 434 can be coupled to one or more inputs 446 such as a grid messaging signal, a performance messaging signal, eminent domain messaging signal, an operations messaging signal, or any combination thereof.

According to an aspect, remote module 400 can also include an output 450 that can include one or more output signals that can be output by communication and control signal generator 436. For example, output 450 can include a real-time generator output signal, a real-time met condition signal, a real-time grid condition signal, a PMU data signal, a real-time congestion reporting signal, a local control status signal, a storage reporting/dispatch status signal, an adjacent asset reporting, a WAN link data signal, a LAN link data signal, or any combination thereof.

According to an aspect, remote module 400 can also include an output 452 that can include one or more output signals that can be output by application layer signal generator 438. For example, output 452 can include a grid monitor output channel, a output forecast output channel, a congestion forecast output channel, a grid simulation output channel, a energy pricing gen output channel, a report generator output channel, a control panel output channel, or any combination thereof.

According to an aspect, remote module 400 can also include an output 454 that can include one or more output signals that can be output by enterprise message signal generator 440. For example, output 454 can include a grid messaging signal, a performance messaging signal, eminent domain messaging signal, an operations messaging signal, or any combination thereof.

According to another aspect, remote module 400 can include a Supervisory Control and Data Acquisition (SCADA) system. A SCADA system can be operable to report and control systems using SCADA information and control signals. In another form, portions or all of remote module 400 can be integrated as a part of a SCADA. According to a further aspect, remote module 400 can also include a PMU integrated as a part of remote module 400. In other forms, portions or all of remote module 400 can be integrated as a part of a PMU. Additionally, remote module 400 can include a PMU data concentrator operable to manage and process PMU data. In other forms, portions or all of remote module 400 can be integrated as a part of a PMU data concentrator.

According to an aspect, the remote module 400 can be collocated with a single energy producing asset such as a wind turbine. Additionally, the remote module 400 can be used as a proactive curtailment system, and can further enable remote monitoring, remote control, and characterization of specific wind turbine.

Figure 5:
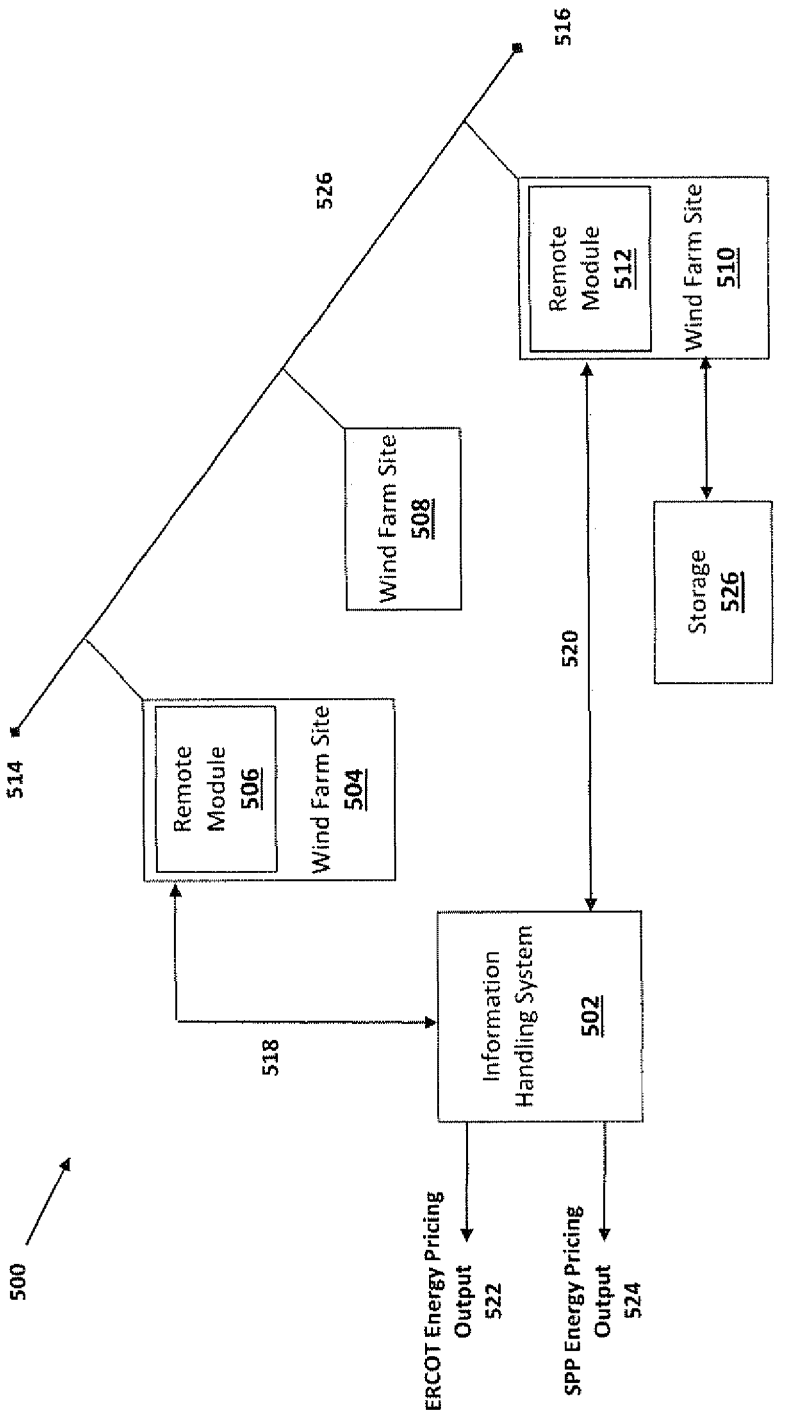
FIG. 5 illustrates a block diagram of an energy management system configured to communicate with a wind energy generation site according to an aspect of the disclosure.

FIG. 5 illustrates a block diagram of an energy management system, illustrated generally at 500, configured to communicate with a wind energy generation site according to an aspect of the disclosure. Energy management system 500 can include an information handling system 502 communicatively coupled to a wind farm site 504 and that includes a remote module 506. Energy management system 500 can also include a wind farm site 508 operable to output energy produced from one or more wind energy generators. The information handling system 502 can also be coupled to a wind farm site 510 and a remote module 512. According to an aspect, information handling system 502 can include portions or all of information handling system 102 described in FIG. 1, information handling system 302 described in FIG. 3, information handling system 702 described in FIG. 7, or any combination thereof.

According to an aspect, wind farm sites 504, 508, 510 can be operable to output energy to an energy grid or energy transmission system partially illustrated at 526. Energy transmission system 526 can include a first location or node 514 and a second location or node 516. As illustrated, wind farm sites 504, 508, 510 can be positioned between nodes 514 and 516.

According to a further aspect, a storage system 526 can also be used at wind farm site 510 to store energy produced by wind farm site 510. For example, a compressed air energy storage (CAES) can be used. CAES stows energy in a reservoir and air can be released powering a wind turbine at wind farm site 510. According to another aspect, storage system 526 can include a battery bank configured to store electricity produced at the wind farm site 510, pumped-storage hydroelectricity systems, or any other type of storage system 526 that can be used to complement a wind farm site 510.

According to a further aspect, information handling system 502 can further be coupled to wind farm site 504 using a communication link 518. Wind farm site 510 can also be coupled to information handling system 502 using a communication link 520. Each communication link 518, 520 can be provided using the data framework described in FIG. 2 above. Additionally, various forms of wireless and wire-line communication mediums can be deployed on a site-by-site basis. For example, communication systems such as cellular, satellite, LAN, WAN, or various other communication systems capable of communicated data between information handling system 502 and a wind farm site.

According to an aspect, information handling system 502 can further include an ERCOT energy pricing output 522. Information handling system 502 can further output an SPP energy pricing output 524. Other market energy pricing outputs, such as WECC, CAISO, national grid, other grids, or any combination thereof, can be output as desired.

According to an aspect, energy outputs can be forecasted for a single wind farm site, or can be forecasted for multiple with farms sites. For example, information handling system 502 can forecast energy outputs of wind farm sites 504, 508, 510 and a resulting grid operating condition. As such, wind farm site 504 and wind farm site 510 may be managed by information handling system 502, and a non-affiliated wind farm site, such as wind farm site 508, can be analyzed to determine an energy output level. In this manner, information handling system 502 can publish proactive curtailments to one or both wind farm sites 504, 510 as desired. For example, if information handling system 502 determines that congestion may occur along a portion of the grid 526 due to an estimated energy output of wind farm site 508 and possible other variables, the information handling system 502 can reduce energy output by the wind farm sites 504, 510 as needed or desired. As such, a reduced exposure to congestion and negative pricing can result and information handling system 502 can utilize any combination of localized congestion forecasts, curtailment forecasts, forecasted meteorological forecast data, real-time meteorological data, asset characterization data, economic attributes, access rights, priority dispatch rules, locational marginal pricing data, or any other inputs, to reduce exposure.

Figure 6:
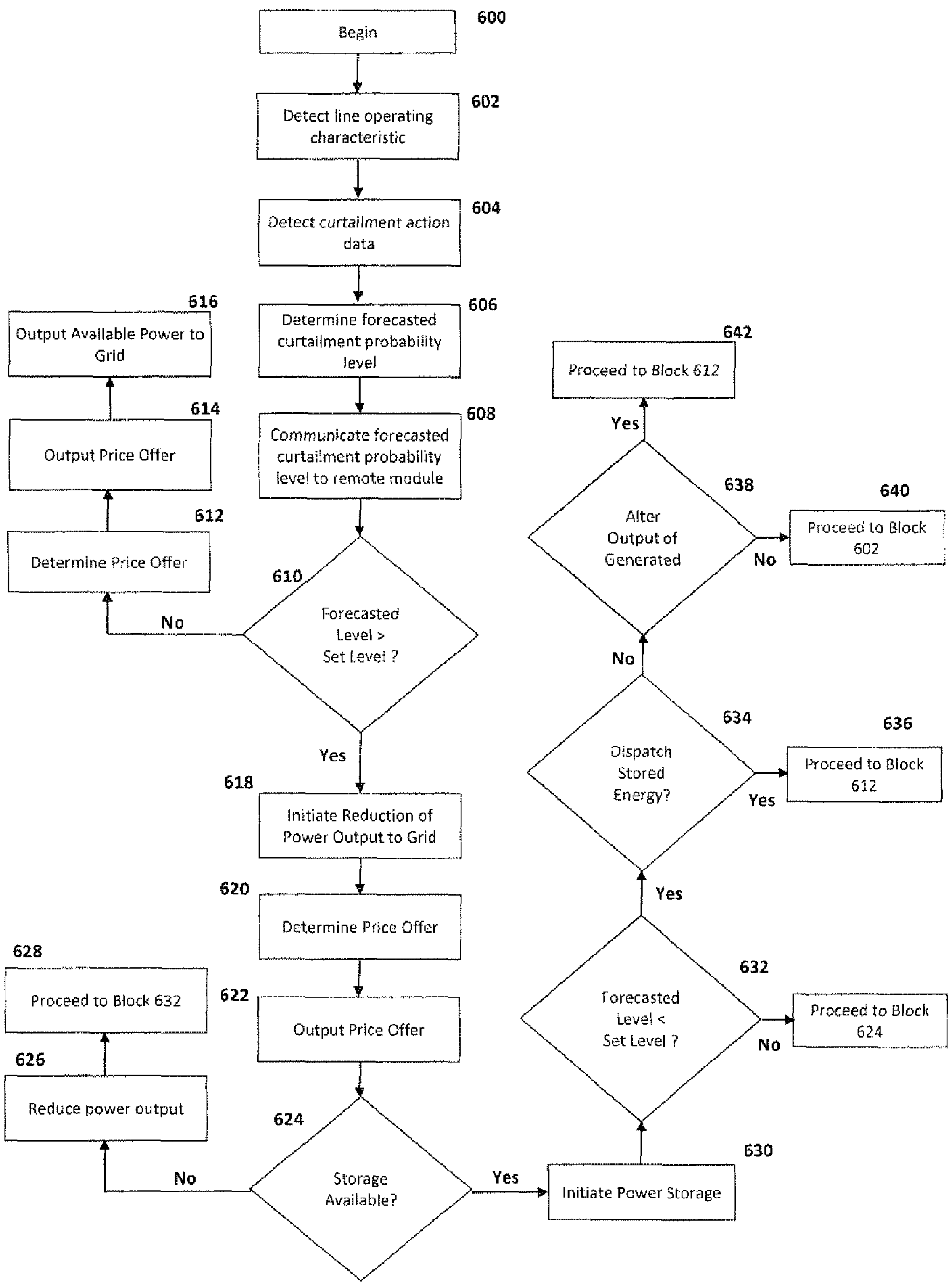
FIG. 6 illustrates a flow diagram of method to manage energy producing assets according to an aspect of the disclosure.

FIG. 6 illustrates a flow diagram of a method to manage energy producing assets according to an aspect of the disclosure. The method of FIG. 6 can be employed in whole, or in part, by energy management system 100 described in FIG. 1, information handling system 300 described in FIG. 3, remote module 400 described in FIG. 4, energy management system 500 described in FIG. 5, energy management system 700 described in FIG. 7 or any other type of system, controller, device, module, processor, or any combination thereof, operable to employ all or portions of, the method of FIG. 6. Additionally, the method can be embodied in various types of encoded logic including software, firmware, hardware, or other forms of digital storage mediums, computer readable mediums, or logic, or any combination thereof, operable to provide all, or portions, of the method of FIG. 6.

The method begins generally at block 600 and can be used to manage power generation of a power generation site operable to be coupled to a transmission line or grid. At block 602, a transmission line operating characteristic can be detected, and at block 604 a curtailment action data can be detected. For example, a curtailment action data can be provided based on analyzing historical curtailments published or issued by a grid operator, real-time curtailments published by a grid operator, calculated or generated curtailment action data, or any combination thereof.

The method can then proceed to block 606 and a forecasted curtailment probability level as a function of the transmission line operating characteristic and the curtailment action data can be determined. According to an aspect, the forecasted curtailment probability level can be communicated to a generation site using a remote module located at a power generation site. Upon determining a forecasted curtailment probability level, the method can proceed to block 610 and detects whether the forecasted curtailment probability level may be greater than the predetermined curtailment probability level or a curtailment set level.

According to an aspect, a forecasted curtailment probability level can be generated using various inputs including, but not limited to using the forecasted energy output level, an electricity consumption data, a market pricing information, and the forecasted congestion probability level can be determined. For example, the method can determine a forecasted curtailment probability level as an estimate or metric to determine the impact of the estimated energy output forecast or forecasted energy output level can have on grid congestion along a certain portion of a grid. Additionally, a curtailment set level can further be generated or accessed. For example, a curtailment set level can be a value that includes determining a grid congestion level that causes grid instability, lower or negative pricing, or various other physical or economic characteristics caused due to congestion. According to an aspect, locational marginal pricing can also be a factor in determining the curtailment set level. According to a further aspect, historical forced curtailment actions can also be used to determine the curtailment set level. For example, a grid operator may publish or issue forced curtailments in connection with grid congestion condition. As such, the current output levels, and historical forced curtailment can be used to generate or predetermine a curtailment set level.

According to an aspect, when the forecasted curtailment probability level may be less than the curtailment set level, the method can proceed to block 612 and a price offer can be determined. For example, a price offer can include a table of price offers over a range of energy output levels. In other forms, a price offer can include a price offer curve, multiple price offer curves, or any combination thereof. Upon determining a price offer, the method can proceed to block 614 and the price offer can be output. For example, the price offer can be communicated to an asset owner, a scheduling entity or other third party, or any combination thereof. According to another aspect, the method can be altered to produce an array of price offer curves that can include risk rated pricing. For example, an asset owner may have a greater risk tolerance that can change. As such, multiple price offer curve or tables may be generated, and used based on an asset owners risk tolerance. Upon generating a price offer, the method can proceed to block 616 and available energy can be output to the grid or a portion of a transmission system.

At decision block 610, if a forecasted curtailment probability level may be greater than the curtailment set level, the method can proceed to block 618 and initiation of a reduction of electricity output to the transmission line or grid can be reduced. For example, according to an aspect a remote module located at the power generation site can initiate reducing power output by decoupling power from the grid or transmission line. In other forms, a lower power level to output can be determined, and a reduction of the power output can be initiated. At block 620, the method can determine a new or second price offer using the reduced power output level, and can proceed to block 622 and outputs the price offer. According to a further aspect, a second price offer can be determined in response to the forecasted curtailment probability level being above the predetermined curtailment probability level. As such, the second price offer can be less than the first price offer and can include an energy output level that is less than a forecasted energy production level The method can then proceed to decision block 624, and determines if storage capacity may be available to store energy that can be generated at the generation site, and may not be output to the transmission line or grid. For example, if the power generation site may be capable of outputting 100 MW of power, and the power output to the grid may be reduced to 50 MW, the remaining 50 MW can be stored using a storage technology such as a battery array. In other forms, the available energy can be used to generate and store compressed air that can be used at a later time, coupled to a behind the grid load center, or various other combinations of use or storage.

If at decision block 624, storage may not be available, the method can proceed to block 626 and power output at the power generation site can be reduced to a specific level. For example, if the power generation site includes multiple wind power generators, a group of wind power generation assets can be identified to be turned off or feathered such that the overall power output of the power generation site can be reduced. According to another aspect, a remote module at a power generation site can be used to reduce the assets at the power generation site. The remote module can predetermine which assets to turn off, and upon receiving a communication that power should be reduced, the remote module can initiate turning off, decoupling, feather assets, or various other power output reduction techniques. The method can then proceed to block 628 and to block 632 as described below.

If at block 624, storage may be available, the method can proceed to block 630, and can initiate power storage of the additional power generation. Power storage can include storing generated power in a battery array. However, power storage can also include using the available power to produce compressed air, or power other devices or systems that can be used at a later time to output energy to the grid.

The method can then proceed to decision block 632, and detects whether the forecasted curtailment probability level may be less than the curtailment set level. If the forecasted curtailment probability level may be detected as greater than the curtailment set level, the method can proceed to block 624 as described above. If at decision block 632 the forecasted curtailment probability level may be detected as less than the curtailment set level, the method can proceed to decision block 634 and detects whether to dispatch stored energy. For example, a high demand transmission line characteristic can be detected, and a simulation on pricing outputting stored energy can be performed. If the current price of energy in a market is too low relative to the overall fixed cost, variable cost, transmission cost, or any combination of characteristics of using the storage system, the stored energy can remain stored until market conditions become favorable. However, if at decision block 634 the stored energy should be dispatched, the method can proceed to block 636 and to block 612. For example, if an air compression storage system is used to store compressed air that can be deployed with a wind generator, the compressed air can be dispatched if the price of energy in the market may be favorable. In other forms, energy can be stored as direct current electricity in a battery array, and if market conditions become favorable, the stored energy can be dispatched in the transmission system (as D.C. or converted to an Alternating Current (A.C.) output).

At decision block 634, if the stored energy should not be dispatched (or in some instances may not be available), the method can proceed to block 638 and detects whether the output of the power generation site should be altered. For example, if the available output capacity of a power generation site can be increased, a determination of the energy production cost can be determined, and power generation can be increased accordingly. In other forms, a power generation site can include wind generators that may be turned off, feathered, etc. As such, the additional capacity can be determined, and a simulation can be performed to detect the level of output that may be available for each of the generators at the power generation site. For example, historical performance data, historical power generation data, historical local and non-local meteorological data, current forecasted meteorological data, current and forecasted congestion data, or various other types of data can be used to determine a predicted output level. As such, the predicted output level can be used to determine a price offer, price offer curves, etc. The method can then proceed to block 642 and to block 612. If the output of generated energy should not be altered the method can proceed to block 640 and to block 602.

Figure 7:
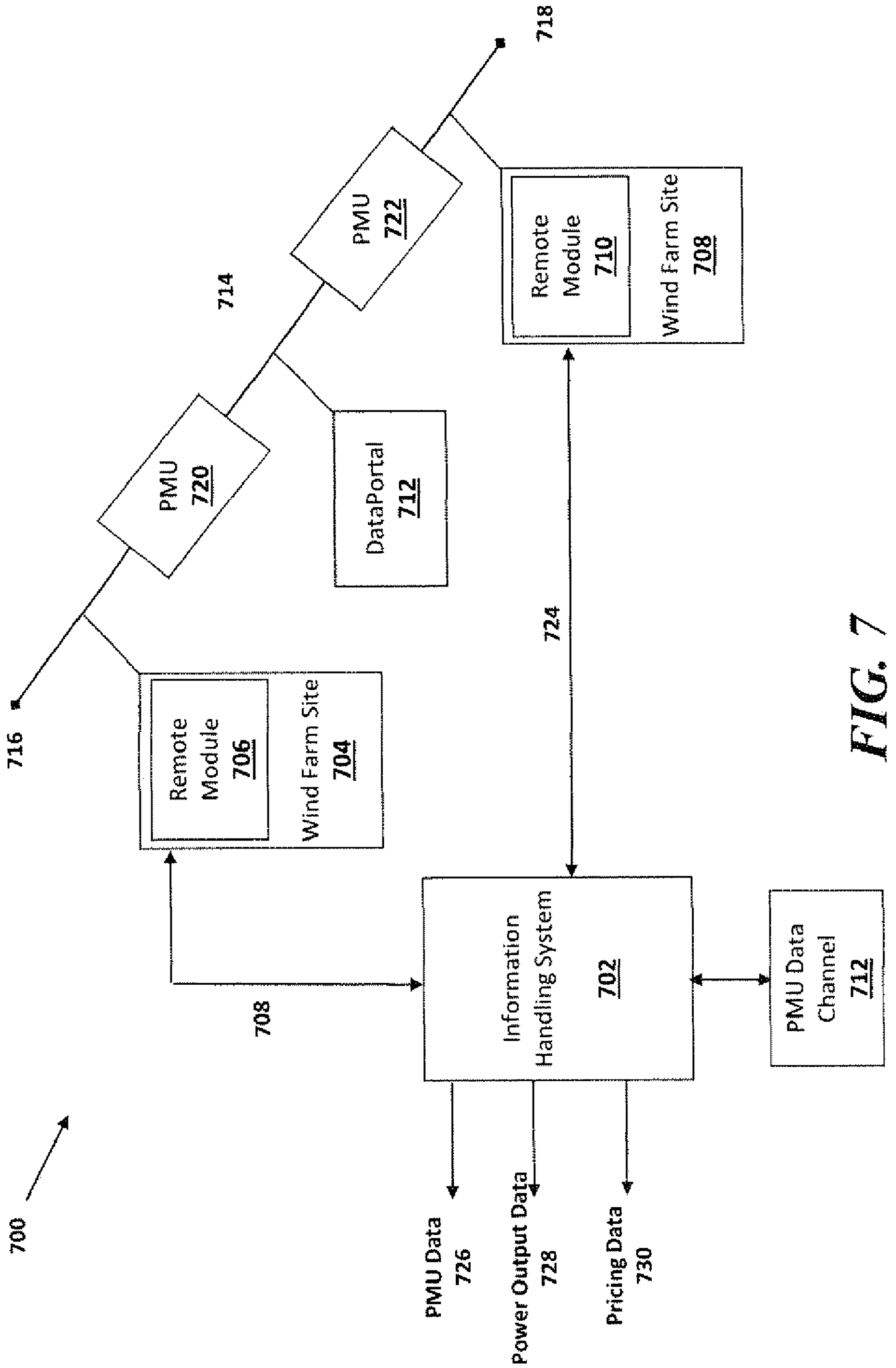
FIG. 7 illustrates a block diagram of phasor measurement unit enabled energy management system according to an aspect of the disclosure.

FIG. 7 illustrates a block diagram of phasor measurement unit enabled energy management system, illustrated generally at 700, according to an aspect of the disclosure. Energy management system 700 can include an information handling system 702. Information handling system 702 can include a portion or all of information handling system 102 illustrated in FIG. 1, information handling system 302 illustrated in FIG. 3, or any other system or combination of systems or components capable of providing energy management system 700. Information handling system 702 can be coupled to a wind farm site 704 including a remote module 706 using a communication link 708. Information handing system 702 can also be coupled to a wind farm site 708 including a remote module 710 using a communication link 724. Energy management system can also include a data portal 712 coupled to a portion of a grid 714. Grid 714 can include a node or grid location 716 and a second node or grid location 718. Grid 714 can also include a first phasor measurement unit (PMU) 720 and a second PMU 722. Each PMU 720, 722 can be a IEEE Standard C37.118-2005 compliant unit. According to a further aspect, PMUs 720, 722 can communicate information using a wireline communication medium coupled to PMUs 720, 722 using various network topologies. According to a further aspect, PMUs 720, 722 can communicate information across electrical transmission lines, using a frequency or range of frequencies capable of communicate PMU data.

In other forms, PMUs 720, 722 can include a wireless communication module capable of communicating over a wireless network to portal 712. For example, PMU 720 can wirelessly communicate data to data portal 712. According to an aspect, data portal 712 may not be available. As such, PMU 722 can be configured to manage or add data received from PMU 720 to a subsequent transmission. In other forms, PMU 722 can transmit PMU 720 data separate from PMU 722 data. As such, PMU 722 can operate as a repeater, communicating PMU 720 data to a another data portal, PMU, PMU concentrator, or network device capable of receiving PMU data.

According to a further aspect, PMUs 720, 722 can be configured as a phasor network. For example, a phasor network can include PMUs dispersed throughout grid 714. Data portal 712 can be configured as a phasor data concentrator operable to access PMU data or information. Data portal 712 can also include a Supervisory Control and Data Acquisition (SCADA) system. During operation, data transfers within the frequency of sampling of the PMU data can be provided, and global position system (GPS) time stamping can be used to enhance accuracy of synchronization. For example, PMUs 720, 722 can deliver between ten (10) and thirty (30) synchronous reports per second depending on the application. Other reporting levels can also be used. Data portal 712 can also be used to correlate the data, and can be used to control and monitor PMUs 720, 722.

According to an aspect, data portal 712 using a SCADA system can output system or grid wide data on all generators, substations, sites within a system over a 2 to 10 second interval, Other intervals can also be used. According to an aspect, PMUs 720, 722 can use a phone lines, or twisted pair, to connect to data portal 712. Data portal 712 can communicate data to a SCADA system and/or Wide Area Measurement System (WAMS) as desired. For example, each wind farm site 70 can include a SCADA system that can be coupled to data portal 712.

According to an aspect, data portal 712 can communicate information generated by one or both PMUs 720, 722. Data portal 712 can be provided as a separate communication device and can be located at a substation. However, in other forms, data portal 712 can be integrated as a part of one or both PMUs 720, 722. Information handling system 702 also includes a PMU data output 726, a power output data 728, and a pricing data output 730.

During operation, any combination of remote module 706, 710 can access information generated by PMUs 720, 722, and alter an operating condition of a wind farm site or energy generator. According to an aspect, remote modules 706, 710 can use various standards or protocol to access data generated by PMUs 720, 722, including, but not limited to Object Linking and Embedding (OLE) for Process Control standards OPC-DA/OPC-HAD and OPC data access standards, International Electrotechnical Commission (IEC) 61850 standard, Bonneville Power Administration (BPA) PDCStream, or various other standards and protocols that can be used association with accessing PMU data.

According to an aspect, remote module 706 can be configured to receive data from PMU 720, and can process the PMU data to detect an operating condition of a portion of grid 714. For example, if a certain operating condition is detected, remote module 706 can initiate altering the output of the wind farm site 704. For example, remote module 706 can initiate disconnecting the wind farm site 704 from grid 714. In other forms, remote module 706 can initiate altering operation of wind generators that exist at wind farm site 704. For example, remote module 706 can detect a subset of wind generators to curtail, disengage, feather (e.g. turn the blades to stop or slow spinning), or generally reduce energy output at wind farm site 704. In this manner, local grid conditions can be detected and operation of a wind farm site can be altered accordingly.

According to a further aspect, remote module 706 can communicate data output by one or both PMUs 722, 724 to information handling system 702. Information handling system 702 can use the real-time PMU data to monitor and simulate grid conditions, and alter operation of wind farm sites 704, 710. In this manner, information handling system 702 may not need to access data portal 712, or a separate data handling system, to obtain real-time operating conditions of the portion of grid 714. According to an aspect, information handling system 702 can output power output data 728, and pricing data 730 in association with PMU data 726 to another location. For example, PMU data 726 can be coupled to a data center associated with a specific grid such as ERCOT, SPP, WECC, CAISO, national grid, other grid or grid regulatory agencies, or any combination thereof.

According to a further aspect, data portal 712 may not be available to output PMU data of PMUs 720, 722. As such, wind farm sites 704, 710 can be used to communicate PMU data to information handling system 702, and output PMU data 736 to one or more destination. As such, one or more wind farm site 704, 710 can be used as a redundant communication network, thereby increasing the overall reliability and security of grid 714.

According to a further aspect, energy management system 700 can be used to provide automatic curtailment of energy outputs using data provided by one or more PMUs 720, 722. For example, wind farm site 704 may be located at a distance from wind farm site 710. Additionally, wind farm site 710 may be located closer to a load center (not illustrated) with the energy produced by wind farm site 710 being more readily accessible to the load center than wind farm site 704. During a period of congestion, PMU 722 may communicate PMU data that can be used to detect congestion. For example, wind farm site 704 can access PMU data communicated via grid 714, data portal 712, information handling system 702, or any combination thereof. Wind farm site 704 can then detect the grid congestion using the PMU data, and alter an operating condition of wind farm site 704.

According to another aspect, one or more of wind farm sites 704, 710 can include a site specific PMU, that is proximally located to wind farm sites 704, 710. For example, the separate PMU can be integrated as a part of the site, and in some forms can be integrated as a part of remote module 706, 712. In other forms, the separate PMU can include a device that is different from remote module 706, 712. In this manner, PMU data can be measured local to the wind farm sites 704, 710, and communicated to information handling system 702, to PMUs 720, 722, to data portal 712, or any combination thereof. Additionally, remote modules 706, 712 can process PMU data and alter operation of wind farm sites 704, 710 on a local level. In this manner, real-time control of wind power generating assets can be provided, thereby reducing the amount of time to respond to grid conditions.

Figure 8:
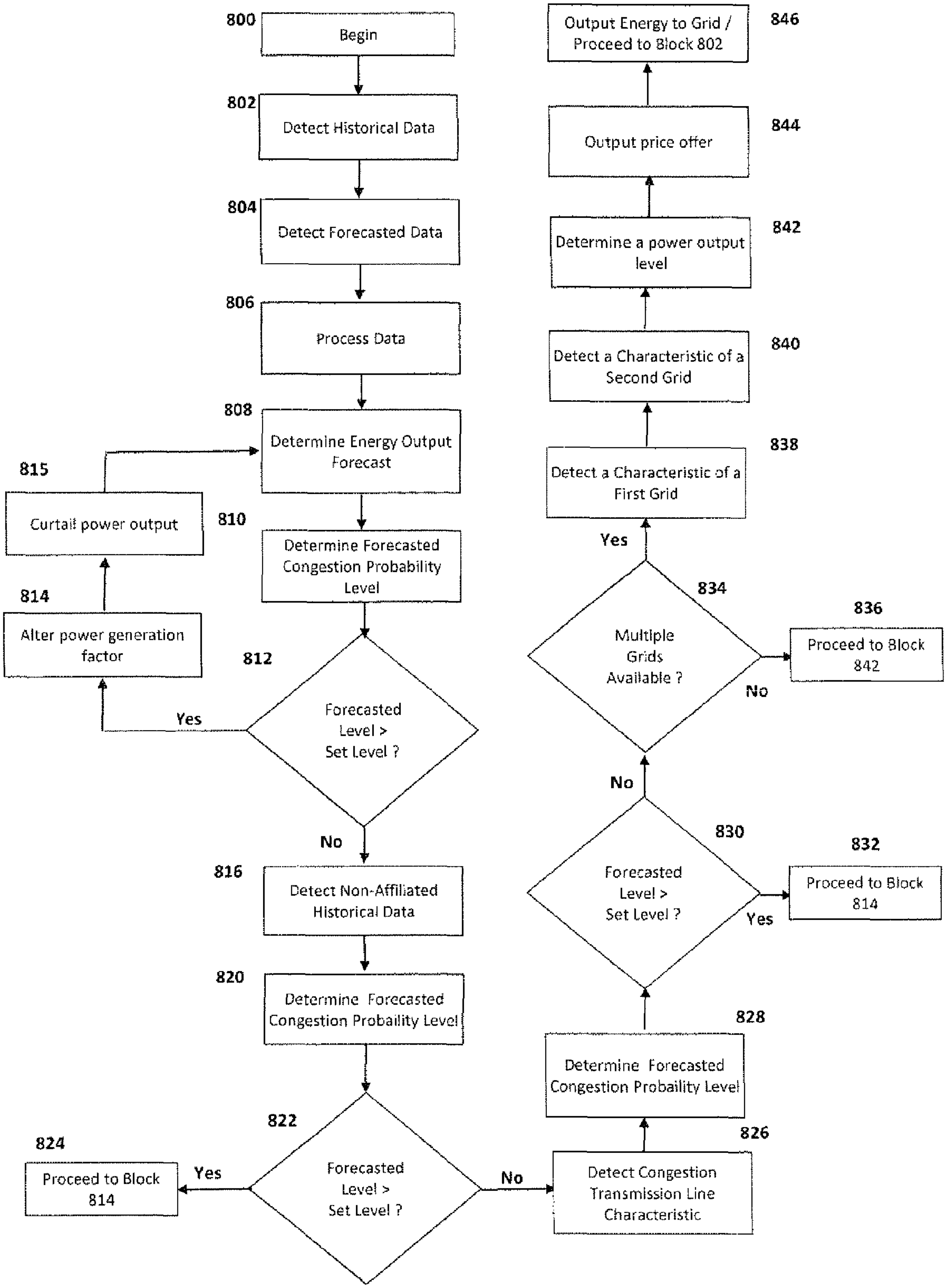
FIG. 8 illustrates a flow diagram of a method to manage energy producing assets according to an aspect of the disclosure.

FIG. 8 illustrates a flow diagram of method to manage energy producing assets according to an aspect of the disclosure. The method of FIG. 8 can be employed in whole, or in part, by energy management system 100 described in FIG. 1, information handling system 300 described in FIG. 3, remote module 400 described in FIG. 4, energy management system 500 described in FIG. 5, energy management system 700 described in FIG. 7 or any other type of system, controller, device, module, processor, or any combination thereof, operable to employ all, or portions of, the method of FIG. 8. Additionally, the method can be embodied in various types of encoded logic including software, firmware, hardware, or other forms of digital storage mediums, computer readable mediums, or logic, or any combination thereof, operable to provide all, or portions, of the method of FIG. 8.

The method begins generally at block 800. At block 802, historical data associated with a power generation site can be detected. For example, a power generation site can include multiple wind generators or assets. As such, historical electricity production data of a plurality of wind generators located at the power generation site can be detected on an asset by asset basis. Additionally, locally generated historical meteorological data generated at the energy production site can also be detected. For example, a site with multiple assets can include a meteorological tower or sensor device that can be collocated with the multiple assets. The method can further include detecting remotely generated historical meteorological data generated from a different location. For example, remotely generated historical meteorological data can be produced by a third party, and in some instance can be produced by meteorological towers or sensors that have strategically placed remote from the power generation site, or any combination thereof.

At block 804, forecasted meteorological data can be detected. For example, meteorological forecasts can be accessed from a third party such as AWS, 3Tier, and others. In some instances, a meteorological forecast can be generated using various meteorological data inputs.

At block 806, two or more of the historical electricity production data, the locally generated historical meteorological data, the remotely generated historical meteorological data, and the forecasted meteorological data can be processed. For example, each of the variables can be analyzed using various statistical analyses generally described as processing the data, including, but not limited to, performing correlations, running regressions, stochastic modeling, deterministic modeling, optimization and co-optimization modeling, or other data analyses, or any combination thereof.

At block 808, a forecasted energy output level of the power generation site using the processed data. For example, the processed data could include an analysis of how the future weather conditions will be impacting a specific asset, group or subset of assets, or all assets at a power generation site. The processed data could further include the results of analyzing historical performance of a each of the assets, group or subset of assets, all assets, and based on both the historical performance and the forecasted weather output, a power output level can be determined for a single period of time or output period, a range of time or output periods, or any combination thereof.

At block 810, a forecasted congestion probability level using the forecasted energy output level, an electricity consumption data, a market pricing information, and the forecasted curtailment probability level can be determined. For example, the method can determine a forecasted congestion probability level as an estimate or metric to determine the impact of the estimated energy output forecast or forecasted energy output level can have on grid congestion along a certain portion of a grid. Additionally, a congestion set level can further be generated or accessed. For example, a congestion set level can be a value that includes a grid congestion level that causes grid instability, lower or negative pricing, or various other physical or economic characteristics caused due to congestion. According to an aspect, locational marginal pricing can also be a factor in determining the congestion set level. According to a further aspect, historical forced curtailment actions can also be used to determine the congestion set level. For example, a grid operator may publish or issue forced curtailments in connection with grid congestion condition. As such, the current output levels, and historical forced curtailment can be used to generate or predetermine a congestion set level.

At decision block 812, the forecasted congestion probability level can be compared to the congestion set level to detect whether the forecasted congestion probability level may be above the predetermined congestion level. For example, the forecasted congestion probability level can include a single value that can be compared to the predetermined congestion set level to determine whether congestion may occur based on a current energy output forecast. It should be understood that each of the values can be converted to a unit that can be used to make the comparison. As such, each value need not be of the same unit type. In other forms, a range of values can also be compare the forecasted congestion probability level and the predetermined congestion set level. For example, a range of forecasted congestion probability levels can be compared to a single predetermined congestion set level, or to a range of predetermined congestion set levels. In another form, control limits can also be deployed as a part of making a comparison.

At decision block 812, if the forecasted congestion probability level may be greater than the predetermined congestion set level, the method can proceed to block 814, and a power generating factor of at least one of the plurality of power generators to decrease electricity production of the power generation site in response to the forecasted congestion probability level being above a predetermined congestion level. The power generation factor can be linked to a single asset, group of assets, or any combination thereof. The power generation factor can be used to reduce the output of a single asset by partially or wholly feathering the blades of a wind generator or asset. The method can then proceed to block 815 and a power output of at least one of the plurality of power generators in response to the detecting of the forecasted congestion probability level being above the predetermined congestion level can be decreased or curtailed. For example, a microcurtailment strategy can be deployed which can include curtailing the output of a power generation site as a function or percentage of the overall output capacity. For example, if 100 MW of power may be available, a microcurtailment strategy can include output a fraction or percentage of the overall capacity (e.g. 80 MW, 50 MW, 20 MW, etc.). In this manner, curtailment of the whole power generation site may avoided. Upon curtailing the power output, the method can proceed to block 808 and can repeat.

According to an aspect, at block 816, non-affiliated historical electricity production data of a plurality of non-affiliated wind generators located at a non-affiliated power generation site can be detected. Additionally, forecasted meteorological data at the non-affiliated power generation site can also be detected. The non-affiliated historical electricity production data and the forecasted meteorological data can be processed, and a non-affiliated forecasted energy output level of the non-affiliated power generation site can be determined. For example, the processed data of the non-affiliated historical electricity production data and the forecasted meteorological data can be used to detect an energy output level, which can impact congestion within the grid. Various analyses can be performed using non-affiliated data that describes or can characterize a non-affiliated power generation site can be performed.

At block 820, an updated forecasted congestion probability level can be determined using the processed data of the non-affiliated historical electricity production data and the forecasted meteorological data. At block 822, the updated forecast congestion probability level can be compared to the predetermined set level. In another form, the predetermined set level can be altered instead of, or in addition to, altering or determining an updated forecasted congestion probability level. If the updated forecasted congestion probability level may be greater than the predetermined set level, the method can proceed to block 824 and operation of power generation site in response to the detected forecasted congestion probability level being above the predetermined congestion level can be altered.

If at block 822, if the updated forecasted congestion probability level may not be greater than the predetermined set level, the method can proceed to block 826, and a congestion transmission line operating characteristic of a portion of a transmission line can be detected. For example, real-time or historical operating characteristics of a transmission line can be detected or forecasted. In an aspect, at block 828 estimated power output levels of the power generation site, the non-affiliated power generation site, or any combination thereof, can be used to deter mine or forecast a congestion transmission line characteristic. In addition, a forecasted congestion probability level relative of the congestion transmission line operating characteristic and curtailment action data can also be determined. An updated forecasted congestion probability level, updated predetermined congestion set level, or any combination thereof can also be generated. For example, the method can determine a forecasted congestion probability level as using an electricity production data, an electricity transmission data, an electricity consumption data, a meteorological data, a market price data, the curtailment action data, a non-affiliated wind energy production forecast data, other data or any combinations of data that can alter or impact congestion within the grid.

At decision block 830, if the updated forecasted congestion probability level may be greater than the predetermined set level, the method can proceed to block 832 and to block 814. For example, transmission of energy can be reduced from the energy production site to the transmission line in response to the forecasted congestion probability level being above the predetermined congestion level. However, in other forms, the method of FIG. 4 can include increasing the electricity being transmitted to the transmission grid in response to the forecasted congestion probability level being below the predetermined congestion level. The method of FIG. 4 can also include altering an output of the power generation site in response to the forecasted congestion probability level being above a predetermined congestion level.

At block 834, an availability of multiple grids or access to multiple grids can also be determined. For example, a power generation site may be capable of outputting power to multiple grids or grid operators such as ERCOT, SPP, WECC, CAISO, renewable energy grid, competitive renewable energy zone (CREZ) grid, a national grid, other markets or operators, or any combination thereof. According to an aspect, a power generation site may be situated in an SPP market and can generate and output energy to an ERCOT market, SPP market, or any combination thereof. According to an aspect, one or more of the markets may have a dedicated renewable energy transmission grid. As such, a power generation site that includes renewable energy can output renewable energy to the dedicated renewable energy transmission grid. If at decision block 834, multiple grids may not be available, the method can proceed to block 836 and to block 842.

If at decision block 834 multiple grids may be available, the method can proceed to block 838, and a grid operating characteristic of a first energy market having a first energy market transmission grid can be detected. The method can then proceed to block 840, and a second grid operating characteristic of a second energy market having a second energy market transmission grid can be detected. According to an aspect, the first energy market transmission grid and the second energy market transmission grid can be located, in whole or in part, within the same energy market. Operating characteristics of each grid can include physical and economic operating characteristics. According to another aspect, operating characteristics can also include detecting priority dispatch rules or regulations of a grid. For example, a priority dispatch may include allowing a one or more affiliated or non-affiliated power generation sites to output energy to a grid or transmission line with a priority level. As such, the method can determine a power output level at block 842. For example, the method can determine available energy production, such as wind energy produced at the power generation site, can be output to a portion of the transmission line. The method can then proceed to block 844, and can determine and output a price offer. In some forms, pricing, output capacity, and various other factors can be considered in the price offer. The method can then proceed to block 836, and available energy production can be coupled to a first portion of a grid or transmission line. For example, the energy production, such as wind energy, can be output to the first portion of the transmission line of a second grid instead of a first grid based on a favorable grid operating condition, economic impact or pricing, or various other factors.

For example, at block 842, a coupling of energy produced at the power generation site to a first portion of the first energy market transmission grid or second portion of the second energy market transmission grid in response to a favorable transmission operating environment of either the first energy market transmission grid or the second energy market transmission grid can be provided.

According to another aspect, the method can include using a phasor measurement unit data in connection with operating the power generation site. For example, the method can include accessing the transmission line operating characteristic generated by a phasor measurement unit at the power generation site, and altering an operating condition of a wind power generator at the power generation site using the accessed transmission line operating characteristic. In this manner, PMU data can be used to proactively curtail or reduce outputs of one or more power generators at a power generation site, and in other forms, at multiple power generation sites.

Note that not all of the activities described above in the general description or the examples are required, that a portion of a specific activity may not be required, and that one or more further activities may be performed in addition to those described. Still further, the order in which activities are listed are not necessarily the order in which they are performed.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Many other embodiments may be apparent to those of skill in the art upon reviewing the disclosure. Other embodiments may be used and derived from the disclosure, such that a structural substitution, logical substitution, or another change may be made without departing from the scope of the disclosure. Accordingly, the disclosure is to be regarded as illustrative rather than restrictive.

Certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A method of managing power generation of a power generation site in communication with at least one transmission line comprising:

transmitting electricity to the transmission line from the power generation site;

employing an information handling system in communication with the transmission line to detect an operating characteristic of the transmission line;

detecting a curtailment action data and a predetermined curtailment probability level of the transmission line;

storing the predetermined curtailment probability level;

analyzing at least the operating characteristic and the curtailment action data to estimate a forecasted curtailment probability level;

comparing the forecasted curtailment probability level to the predetermined curtailment probability level; and reducing the electricity being transmitted from the power generating site to the transmission line in response to the forecasted curtailment probability level being above the predetermined curtailment probability level to reduce the probability of a future congestion of the transmission line.

2. The method as set forth in claim 1 further comprising:

determining a first price offer of electricity to be sold within a first energy market;

determining a second price offer in response to the forecasted curtailment probability level being above the predetermined curtailment probability level, wherein the second price offer is less than the first price offer and includes an energy output level that is less than a forecasted energy production level; and outputting the second price offer and the energy output level to the first energy market.

3. The method as set forth in claim 1 wherein said reducing the electricity being transmitted from the power generation site to the transmission line in response to the forecasted curtailment probability level being above the predetermined curtailment probability level comprises re-routing the electricity to a power storage device accessible to the power generation site to store energy within the power storage device.

4. The method as set forth in claim 3 further comprising detecting a high demand transmission line characteristic, and dispatching the stored energy from the power storage device to the transmission line in response to the high demand transmission line characteristic.

5. The method as set forth in claim 1 further comprising communicating the forecasted curtailment probability level to a remote module of the power generation site.

6. The method as set forth in claim 1 further comprising:

detecting historical electricity production data of a plurality of wind generators located at the power generation site;

detecting locally generated historical meteorological data generated at the power generation site;

detecting remotely generated historical meteorological data generated from a different location;

detecting forecasted meteorological data;

analyzing the historical electricity production data, the locally generated historical meteorological data, the remotely generated historical meteorological data, and the forecasted meteorological data to estimate a forecasted energy output level of the power generation site.

7. The method as set forth in claim 6 further comprising analyzing at least the forecasted energy output level and an electricity consumption data and a market pricing information and the forecasted curtailment probability level to estimate a forecasted congestion probability level.

8. The method as set forth in claim 6 further comprising:

altering a power generating factor of at least one of the plurality of wind generators to increase electricity production of the power generation site in response to a forecasted congestion probability level being below a predetermined congestion level; and detecting the forecasted congestion probability level being above the predetermined congestion level; and decreasing a power output of at least one of the plurality of power wind generators in response to the detecting of the forecasted congestion probability level being above the predetermined congestion level.

9. The method as set forth in claim 6 further comprising:

detecting non-affiliated historical electricity production data of a plurality of non-affiliated wind generators located at a non-affiliated power generation site;

correlating the non-affiliated historical electricity production data and the forecasted meteorological data;

determining a non-affiliated forecasted energy output level of the non-affiliated power generation site using the correlation of the non-affiliated historical electricity production data and the forecasted meteorological data;

detecting a forecasted congestion probability level using the correlation of the non-affiliated historical electricity production data and the forecasted meteorological data; and altering operation of power generation site in response to the detected forecasted congestion probability level being above a predetermined congestion level.

10. The method as set forth in claim 1 further comprising:

detecting a congestion transmission line operating characteristic of a portion of a transmission line; and estimating a forecasted congestion probability level as a function of the congestion transmission line operating characteristic and the curtailment action data; and altering an output of the power generation site in response to the forecasted congestion probability level being above a predetermined congestion level.

11. The method as set forth in claim 10 further comprising:

estimating the forecasted congestion probability level as as a function of an electricity production data, an electricity transmission data, an electricity consumption data, a meteorological data, a market price data, the curtailment action data, and a non-affiliated wind energy production forecast data;

reducing the electricity being transmitted from the power generation site to the transmission line in response to the forecasted congestion probability level being above the predetermined congestion level; and increasing the electricity being transmitted to the transmission line in response to the forecasted congestion probability level being below the predetermined congestion level.

12. The method as set forth in claim 1 further comprising:

detecting a grid operating characteristic of a first energy market having a first energy market transmission grid;

detecting a second grid operating characteristic of a second energy market having a second energy market transmission grid;

enabling a coupling of energy produced at the power generation site to a first portion of the first energy market transmission grid or second portion of the second energy market transmission grid in response to a favorable transmission operating environment of either the first energy market transmission grid or the second energy market transmission grid.

13. The method as set forth in claim 1 further comprising:

detecting a dispatch priority of a portion of the transmission line;

determining whether wind energy produced at the power generation site can be output to a first portion of the transmission line; and enabling an output of the wind energy to the first portion of the transmission line in response to the determination.

14. The method as set forth in claim 1, further comprising:

accessing the transmission line operating characteristic generated by a phasor measurement unit at the power generation site; and altering an operating condition of a wind power generator at the power generation site using the accessed transmission line operating characteristic.

15. An energy management system configured to manage power generation of a power generation site in communication with at least one communication line, the energy management system comprising:

an information handling system operable to:

detect an operating characteristic of at least one transmission line in communication with a power generation site;

detect a curtailment action data and a predetermined curtailment probability level of the transmission line;

analyze at least the operating characteristic and the curtailment action data to estimate a forecasted curtailment probability level;

compare the forecasted curtailment probability level to the predetermined curtailment probability level; and a remote module communicatively coupled to the information handling system and operable to:

initiate a transmission of electricity to the transmission line and reduce the electricity being transmitted to the transmission line in response to the forecasted curtailment probability level being above the predetermined curtailment probability level for reducing the probability of a future congestion of the transmission line.

16. The energy management system as set forth in claim 15, the information handling system further operable to:

determine a first price offer of electricity to be sold within a first energy market;

determine a second price offer in response to the forecasted curtailment probability level being above the predetermined curtailment probability level, wherein the second price offer is less than the first price offer and includes an energy output level that is less than a forecasted energy production level; and output the second price offer and the energy output level to the first energy market.

17. The energy management system as set forth in claim 15 further comprising:

an energy storage device configured to store electricity in response to the information handling system detecting the forecasted curtailment probability level being above the predetermined curtailment probability level; and wherein the remote module is operable to:

initiate transmission of electricity to the power storage device accessible to the power generation site to store energy within the power storage device in response to the forecasted curtailment probability being above the predetermined curtailment probability level; and wherein the information handling system is further operable to:

detect a high demand transmission line characteristic; and dispatch the stored energy from the power storage device to the transmission line.

18. The energy management system as set forth in claim 15, wherein the information handling system is operable to:

detect historical electricity production data of a plurality of wind generators located at the power generation site;

detect locally generated historical meteorological data generated at the power generation site;

detect remotely generated historical meteorological data generated from a different location;

detect forecasted meteorological data;

process the historical electricity production data, the locally generated historical meteorological data, the remotely generated historical meteorological data, and the forecasted meteorological data; and determine a forecasted energy output level of the power generation site using the processed data.

* * * * *

UNITED STATES PATENT AND TRADEMARK OFFICE

CERTIFICATE OF CORRECTION

PATENT NO. : 7,930,070 B2
APPLICATION NO. : 12/567394
DATED : April 19, 2011
INVENTOR(S) : Kevin Imes It is certified that error appears in the above-identified patent and that said Letters Patent is hereby corrected as shown below:

Column 20, Line 42 "deter_mind" should read -- determine --
Column 24, Line 4 "power wind generators" should read -- "wind generators" --

Signed and Sealed this
Fourteenth Day of June, 2011

David J. Kappos
*Director of the United States Patent and Trademark Office*